United States Patent
Nishijima et al.

(10) Patent No.: US 6,878,401 B2
(45) Date of Patent: Apr. 12, 2005

(54) SUBSTRATE PROCESSING METHOD

(75) Inventors: Kazuhiro Nishijima, Kikuyo-Machi (JP); Tsuyoshi Mizuno, Kikuyo-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 21 days.

(21) Appl. No.: 10/255,581

(22) Filed: Sep. 27, 2002

(65) Prior Publication Data
US 2003/0059534 A1 Mar. 27, 2003

(30) Foreign Application Priority Data
Sep. 27, 2001 (JP) .......................... 2001-297260

(51) Int. Cl.[7] .................................................. B05D 1/02
(52) U.S. Cl. .................. 427/240; 427/425; 118/52; 118/320; 438/780; 438/782
(58) Field of Search .................... 427/240, 425; 118/52, 320; 438/780, 782

(56) References Cited

U.S. PATENT DOCUMENTS

| | | | | |
|---|---|---|---|---|
| 4,416,213 A | * | 11/1983 | Sakiya | 118/52 |
| 5,261,566 A | * | 11/1993 | Nakayama | 222/108 |
| 5,928,425 A | * | 7/1999 | Lee | 118/712 |
| 6,054,181 A | * | 4/2000 | Nanbu et al. | 427/240 |
| 6,062,442 A | * | 5/2000 | Yang et al. | 222/571 |
| 6,592,936 B1 | * | 7/2003 | Arioka | 427/162 |
| 2001/0036424 A1 | * | 11/2001 | Takahashi et al. | 422/100 |

FOREIGN PATENT DOCUMENTS

| | | |
|---|---|---|
| JP | 04-200768 | 7/1992 |
| JP | 11-333359 | 12/1999 |

* cited by examiner

*Primary Examiner*—Kirsten Jolley
(74) *Attorney, Agent, or Firm*—Oblon, Spivak, McClelland, Maier & Neustadt, P.C.

(57) ABSTRACT

A specific amount of a processing solution is supplied on a wafer by spraying the processing solution from a first end (tip) of a nozzle. The solution surface of the processing solution remaining in the nozzle is sucked back to a second end side of the nozzle by aspirating the remaining processing solution to the second end side. The first end of the nozzle is then soaked into a fluid. The processing solution remaining in the nozzle is aspirated to the second end side to aspirate a specific amount of the fluid into the first end of the nozzle for further sucking back the solution surface of the processing solution to the second end side, thus the solution surface of the processing solution being not touching the fluid.

14 Claims, 10 Drawing Sheets

SUBSTRATE PROCESSING METHOD

BACKGROUND OF THE INVENTION

The present invention relates to a method of processing a substrate.

A semiconductor-device manufacturing process includes a film-forming step of forming an inter-layer insulating film, such as, a SOD (Spin On Dielectric) film on a semiconductor wafer. Such a film-forming step requires a coating step of applying a coating solution on the wafer.

In the coating step, a nozzle is moved over the wafer center and a specific amount of coating solution is sprayed from the nozzle onto the wafer center, followed by rotating the wafer so that the coating solution is spread over the wafer surface by centrifugal force, thus a coating film being formed on the wafer surface at a specific thickness.

The coating solution adheres to the tip of the nozzle after completion of spraying. The adhered solution will be dried and crystallized if not removed, causing generation of particles. It is thus required to remove, as much as possible, the coating solution adhered at the tip of the nozzle after completion of spraying.

Not only that, the top surface of the coating solution will stop in the nozzle near the tip thereof when spraying halts. The coating solution remaining in the nozzle will also be dried and deteriorated. The coating solution remaining in the nozzle thus requires to be protected from being dried and deteriorated for the next use.

To solve problems, for example Japanese Unexamined Patent Publication No. 4-200768 discloses a method of soaking a nozzle into a bath of solvent after completion of spraying.

Such a method is, however, disadvantageous in that the nozzle inner surface will not be washed well because the nozzle will not be filled enough with solvent completion of spraying.

The coating solution remaining in the nozzle will be protected from becoming dry when the nozzle is soaked into the bath. The remaining solution will, however, touch the solvent and hence could be mixed with the solvent, which could cause contamination and deterioration of the coating solution, thus resulting in incomplete formation a coating film on a wafer to be processed next.

Moreover, much dummy dispensing after the completion of the coating step for one wafer in order to supply a pure coating solution to the next wafer causes increase in consumption of coating solution and hence high cost.

SUMMARY OF THE INVENTION

A purpose of the present invention is to provide a method of processing a substrate with removal of a processing solution such as a coating solution adhered to the tip of a nozzle, thus protecting the processing solution in the nozzle from contamination and deterioration.

The present invention provides a method of processing a wafer including: a supplying step of supplying a specific amount of a processing solution on a wafer by spraying the processing solution from a first end of a nozzle; a sucking-back step, after the supplying step, of sucking back a solution surface of the processing solution remaining in the nozzle to a second end side of the nozzle by aspirating the remaining processing solution to the second end side; a soaking step, after the sucking-back step, of soaking the first end of the nozzle into a fluid; and an aspirating step, after the soaking step, of aspirating the processing solution remaining in the nozzle to the second end side to aspirate a specific amount of the fluid into the first end of the nozzle for further sucking back the solution surface of the processing solution to the second end side, thus the solution surface of the processing solution being not touching the fluid.

DETAILED DESCRIPTION OF PREFERRED EMBODIMENTS

Preferred embodiments according to the present invention will be disclosed with reference to the attached drawings.

Figure 1:
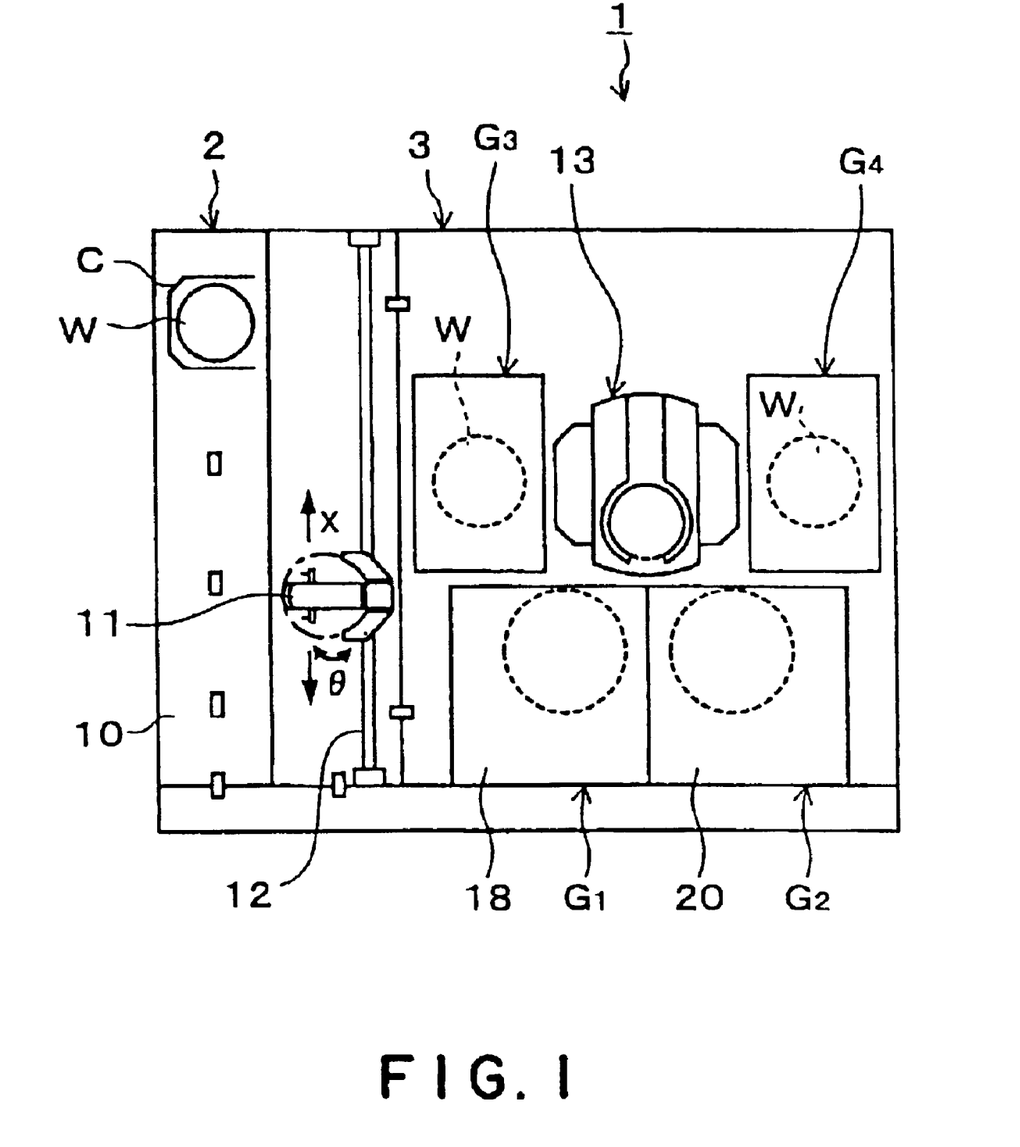
FIG. 1 is a plan view illustrating a SOD-film forming system in an embodiment.

As shown in FIG. 1, a SOD (Spin On Dielectric)-film forming system 1 is equipped with a cassette station 2 and a processing section 3.

Twenty-five wafers W, for example, contained in a cassette C are transferred to/from the SOD-film forming system 1, or several wafers W are transferred to/from the cassette C via the cassette station 2.

The processing section 3 has multiple states of processing units for processing wafers W in a SOD-film forming procedure per specific number of wafers.

Several cassettes C can be placed on the cassette station 2 in a direction X (the perpendicular direction in FIG. 1). A transfer arm 11 is provided as movable along a transfer passage 12 in the direction (direction X) in which cassettes C are arranged and also in a direction (the vertical direction Z) in which wafers W have been installed in each cassette C, thus the transfer arm 11 being accessible to any cassette C.

The transfer arm 11 has an alignment function for wafer positioning. It is also accessible to an extension unit 31 belonging to a third processing-unit group G3 at the processing section 3 side, as disclosed later.

Provided in the center of the processing section 3 is a main transfer mechanism 13 surrounded by several multi-stage processing units.

The SOD-film forming system 1 is equipped with four processing-unit groups G1, G2, G3 and G4. The first and the second unit groups G1 and G2 are arranged at the front side of the system 1. The third unit group G3 is set at the cassette station 2 side. The fourth unit group G4 is set so that the main transfer mechanism 13 is interposed between the unit groups G3 and G4.

The transfer mechanism 13 is accessible to these processing-unit groups so that it can transfer wafers W to/from several processing units (disclosed layer) installed in these groups.

The number of processing-unit groups depends on what types of processes are applied to each wafer W, or any number of unit groups is available.

Figure 2:
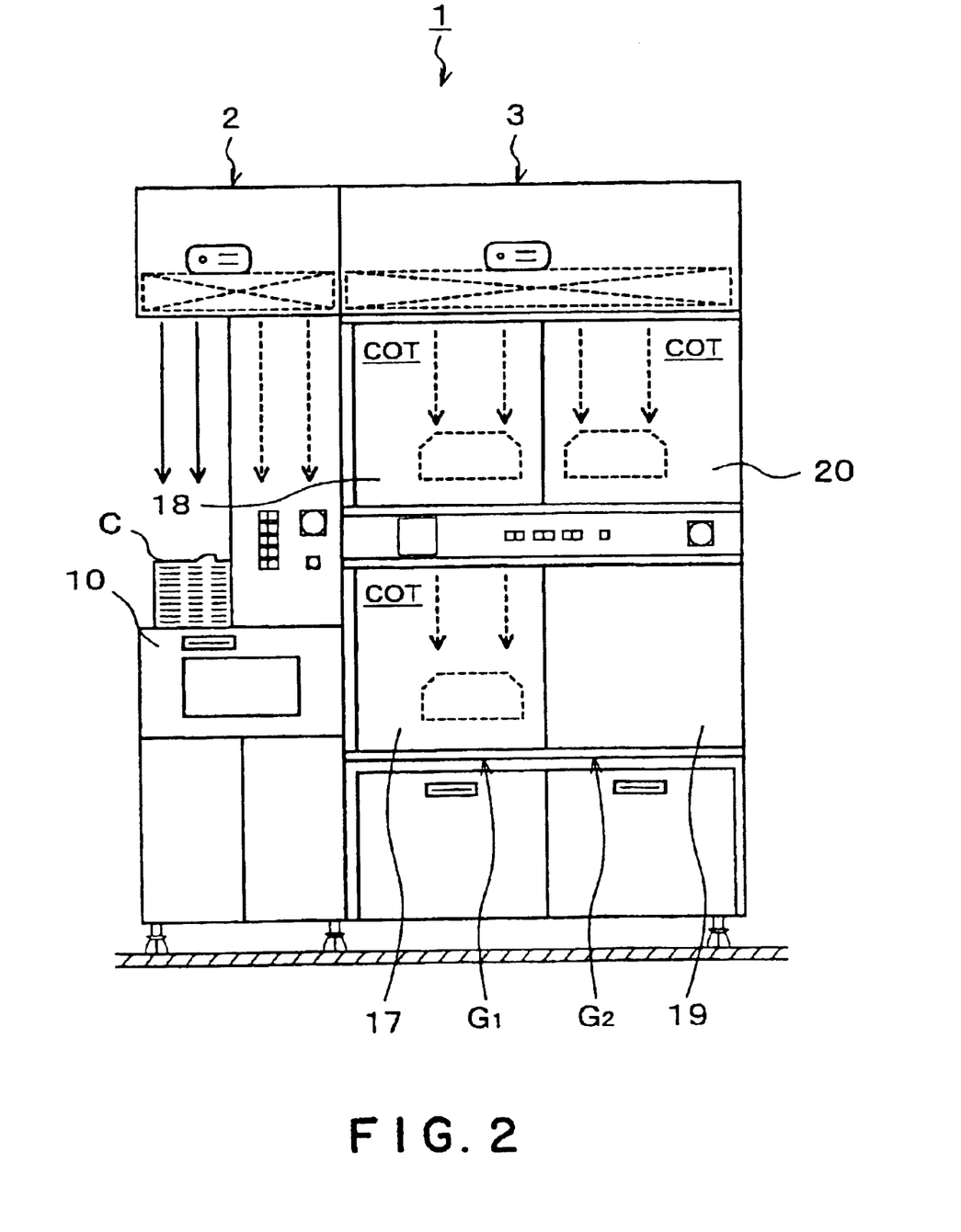
FIG. 2 is a front view illustrating the SOD-film forming system shown in FIG. 1.

The first processing-unit group G1 is equipped with coating-processing units 17 and 18 stacked in order as shown in FIG. 2, which perform a processing method according to the present invention. The second processing-unit group G2 is equipped with a solution cabinet 19 and a coating-processing unit 20 stacked in order also as shown in FIG. 2. Contained in the cabinet 19 are a coating solution and a solvent to be used in the coating-processing units.

Figure 3:
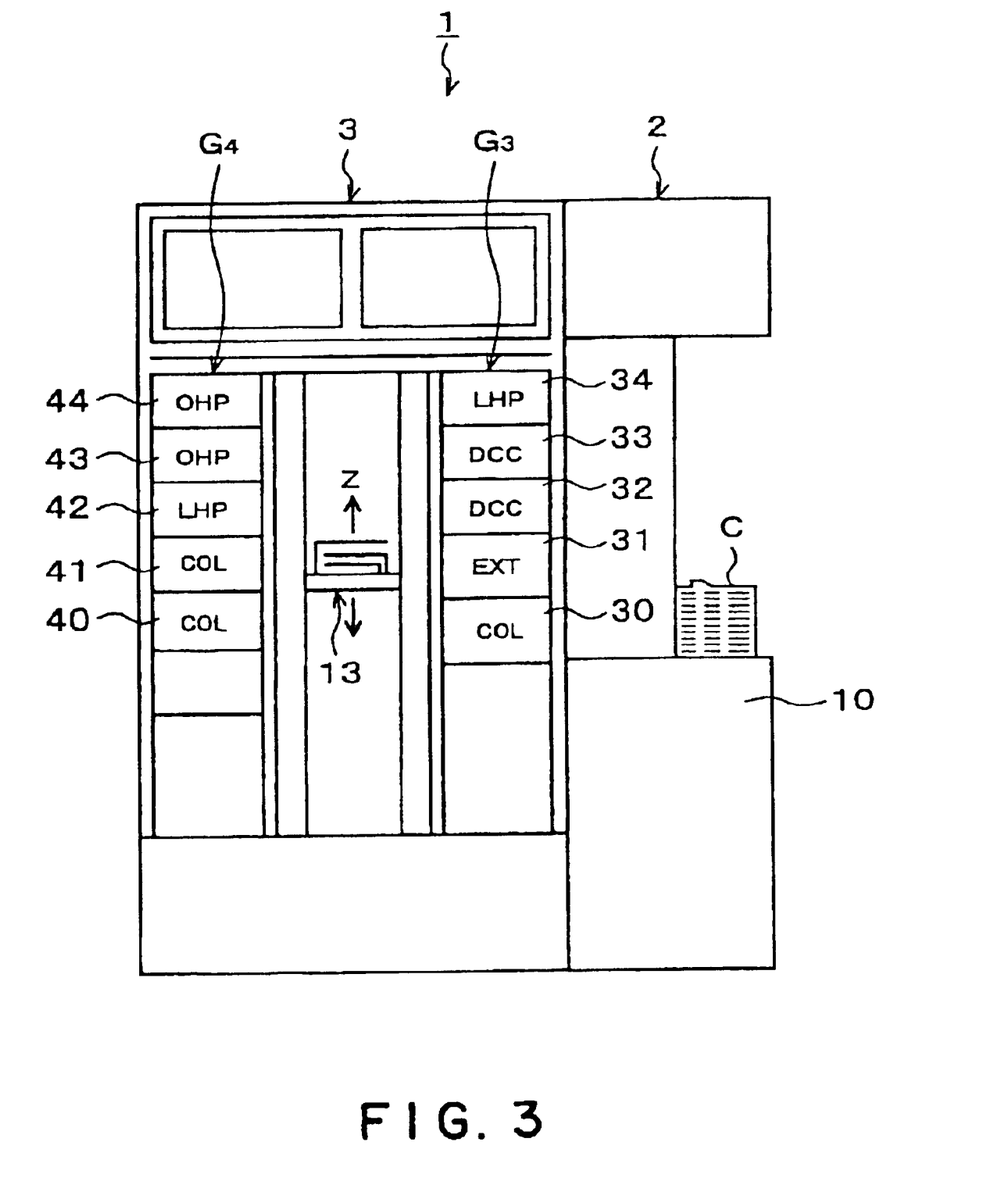
FIG. 3 is a rear view illustrating the SOD-film forming system shown in FIG. 1.

The third processing-unit group G3 is equipped with, as shown in FIG. 3, a cooling unit 30 for cooling wafers W, the extension unit 31 for wafer transfer between several processing units, DCC (Dielectric Cure and Cooling-off) units 32 and 33 for curing the wafers W and a low-temperature heating unit 34 for heating the wafers W at a low temperature, stacked in order in five stages.

The fourth processing-unit group G4 is equipped with, as shown in FIG. 3, cooling units 40 and 41, a low-temperature heating unit 42 and low-oxygen-pressure heating units 43 and 44 for heating wafers W in a low-oxygen-pressure atmosphere, stacked in order in five stages.

Disclosed next in detail is the coating-processing unit 17.

Figure 4:
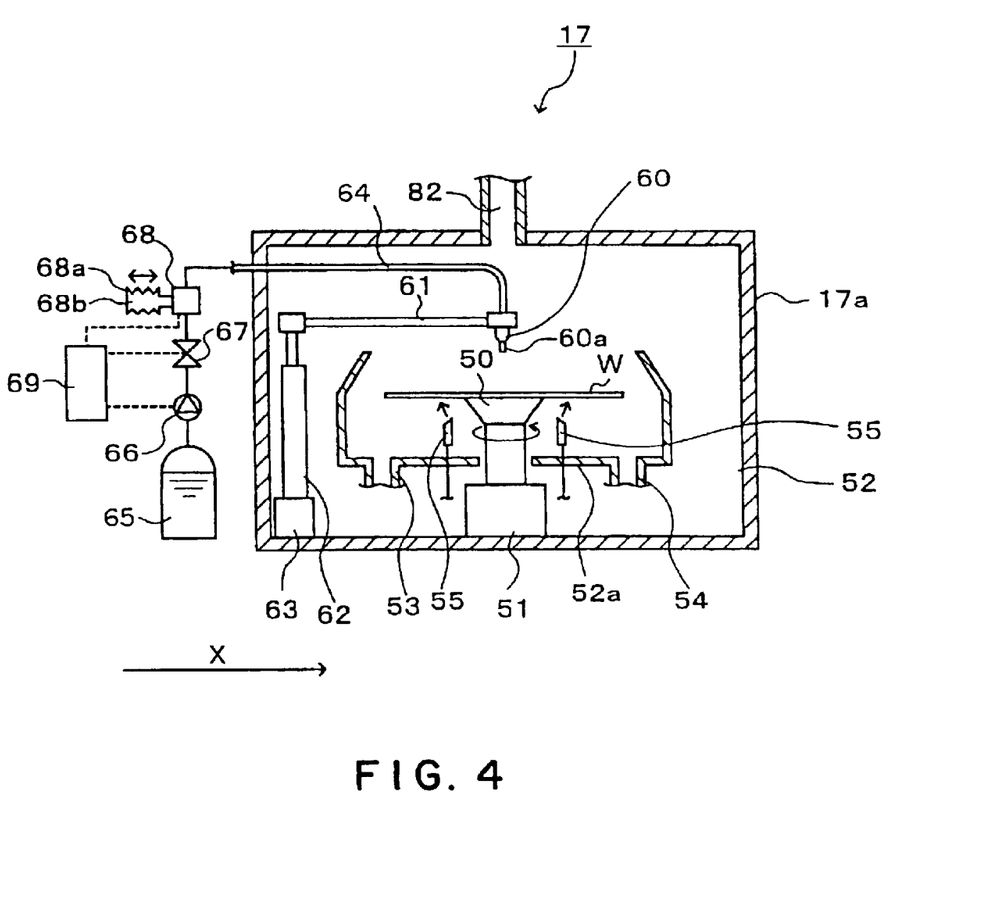
FIG. 4 is a vertical sectional view illustrating a coating-processing unit.

The coating-processing unit 17 has a casing 17a, as shown in FIG. 4. Provided in the center of the processing unit 17 is a spin chuck 50 for holding and rotating a wafer W. The spin chuck 50 has a flat top surface on which a sucking opening (not shown) is formed through which the wafer W is sucked so that it can be held horizontally.

The spin chuck 50 is rotated at a specific speed by a rotation driver 51 incorporating a motor, provided under the spin chuck.

A cup 52 is placed to enclose the spin chuck 50 to receive a coating solution, etc. spread from the wafer W. The spin chuck 50 is enclosed by the cup 52 except the upward section. Provided at a bottom surface 52a of the cup 52 are a waste-solution disposal pipe 53 through which the coating solution received by the cup 52 will be disposed and also an exhaust pipe 54 through which gas in the cup 52 will be discharged.

Proved under the wafer W held by the spin chuck 50 in the cup 52 is cleaning-fluid supply nozzles 55 for spraying a cleaning fluid such as thinner to wash the rear wafer surface.

The coating-processing unit 17 is equipped further with a coating-solution spray nozzle 60 for spraying a coating solution onto the wafer, such as polyphenylene as the processing solution to become a SOD film. The coating-solution spray nozzle 60 is supported by a nozzle arm 61 that is further supported by a pole 62 standing vertically.

The nozzle arm 61 is movable vertically over the pole 62 by a driving mechanism (not shown). The movable nozzle arm 61 allows the coating-solution spray nozzle 60 to be movable vertically so that the distance between the nozzle 60 and the wafer W can be adjusted and also a tip 60a of the nozzle 60 can be soaked into a solvent in a bath 80 (disclosed layer).

The nozzle arm 61 is also movable horizontally in a direction X (right and left in FIG. 4) by a driving mechanism (not shown) so that the coating-solution spray nozzle 60 is movable in the direction X.

Provided on the bottom surface of the coating-processing unit 17 in a specific direction (a direction Y in FIG. 5) is a guide rail 63 on which the pole 62 is movable by a driving mechanism (not shown) so that the coating-solution spray nozzle 60 can move from a waiting section 81 (disclosed later) to above the center of the wafer W for spraying a coating solution onto the wafer W.

Connected to the coating-solution spray nozzle 60, as shown in FIG. 4, is a coating-solution supply pipe 64 that is communicating with a coating-solution tank 65. Provided between the pipe 64 and the tank 65 are a pump 66 for sending a coating solution from the tank 65 to the nozzle 60 and also an open/close valve 67 for opening/closing the pipe 64. The coating solution sent from the tank 65 by the pump 66 will be sprayed from the nozzle 60 through the pipe 64 but shut out under control by the valve 67.

The coating-solution supply pipe 64 is provided with a suck-back valve 68 for sucking back the coating solution to the pipe 64 side, which will remain in the coating-solution spray nozzle 60 when spraying is brought in a halt.

The suck-back valve 68 is equipped with a bellows 68a having a sucking chamber 68b communicating with the coating-solution supply pipe 64. The bellows 68a can be elongated to increase the capacity of the chamber 68b to create a negative pressure in the pipe 64 for sucking back the coating solution in the coating-solution spray nozzle 60 to the pipe 64 side.

The suck-back valve 68 is also equipped with a needle (not shown) for varying the maximum capacity of the sucking chamber 68b to adjust the distance by which the top surface of the coating solution in the coating-solution spray nozzle 60 is suck back to the coating-solution supply pipe 64 side.

The pump 66, the open/close valve 67 and the sucking valve 68 are under control by a controller 69. In detail, the controller 69 controls activation/disactivation of the pump 66, opening/closing of the valve 67 and elongation/contraction of the bellows 68a of the sucking valve 68. Spraying, sucking-back of coating solution, etc. are executed under processing programs installed in the controller 69.

Figure 5:
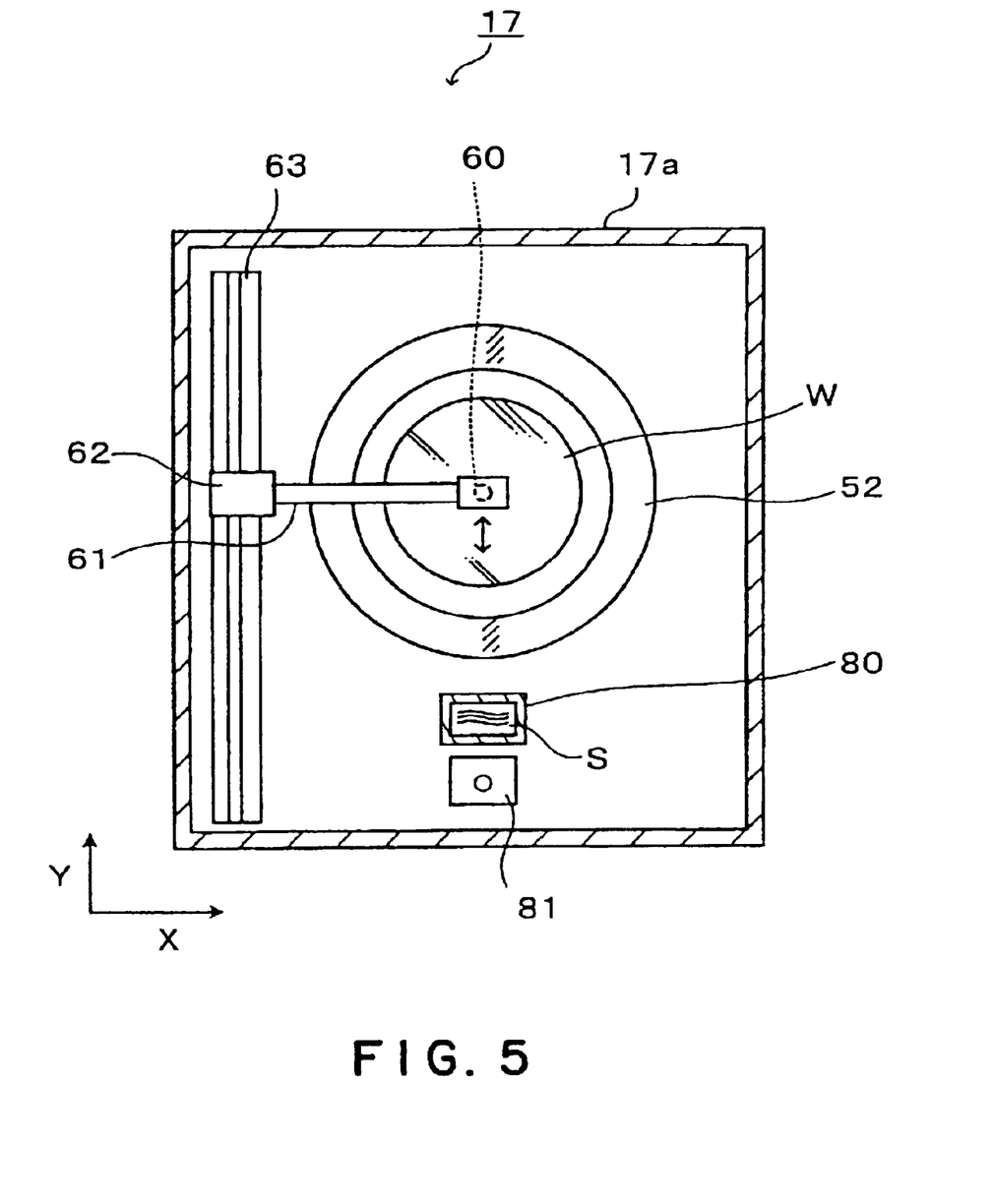
FIG. 5 is a horizontal sectional view illustrating the coating-processing unit shown in FIG. 4.

As shown in FIG. 5, a solution bath 80 is provided outside the cup 52 in the lower side in the direction Y. Contained in the bath 80 is a solvent for the coating solution, such as, cyclohexanone, mesitylene and PGMEA (Propylene Glycol Monomethyl Ether). The bath 80 is a box-like bath placed in the area to which the coating-solution spray nozzle 60 is reachable. In other words, the nozzle 60 can be moved to the bath 80 and then the tip 60a of the nozzle can be soaked into the solvent in the bath. Not only that, the coating solution in the nozzle 60 can be sucked back to aspirate the solvent into the tip 60a of the nozzle.

Also provided in the lower side of the solution bath 80 is the waiting section 81 in which the coating-solution spray nozzle 60 can stand ready for the next coating-solution spraying step.

Connected to the casing 17a at its top surface is a duct 82 through which a temperature- and moisture-adjusted clean gas, such as, nitrogen, inert gas or air is supplied into the cap 52 to create a specific ambient atmosphere while a wafer W is being under the coating step.

Disclosed next are a method of processing a wafer W to be conducted in the coating-processing unit 17 and also a SOD-film forming process to be conducted in the SOD-film forming system 1.

Unprocessed wafers W are taken out, one by one, from each cassette C by the transfer arm 11 and transferred to the extension unit 31 belonging to the third processing-unit group G3. Each wafer W is then transferred to the cooling unit 30 by the main transfer mechanism 13 and cooled to a specific temperature. The cooled wafer W is transferred further to the coating-processing unit 17 by the transfer mechanism 13.

Each wafer W on which a coating film has been formed in the coating-processing units 17 is transferred by the main transfer mechanism 13 to the low-temperature heating unit 34 or 42, the low-oxygen-pressure heating unit 43 or 44, the DCC unit 32 or 33 and the cooling unit 30 successively for respective processing.

The wafer W cooled in the cooling unit 30 is returned to the extension unit 31 by the main transfer mechanism 13 and then to the cassette C by the transfer arm 11, thus the SDM-film forming process being completed.

A method of processing a wafer W to be conducted in the coating-processing unit 17 is disclosed in detail.

Before wafer transfer to the coating-processing unit 17, for example, a clean air is supplied into the unit 17 through the duct 82 while gas in the cup 52 is being discharged through the exhaust pipe 54, to create and maintain a specific ambient atmosphere in the unit 17.

A wafer W for which a cooling process has been applied is then transferred into the coating-processing unit 17 and held on the spin chuck 50 while being sucked. The coating-solution spray nozzle 60 situated in the waiting section 81 is moved over the wafer center by the nozzle arm 61 supported on the pole 62.

Figure 6:
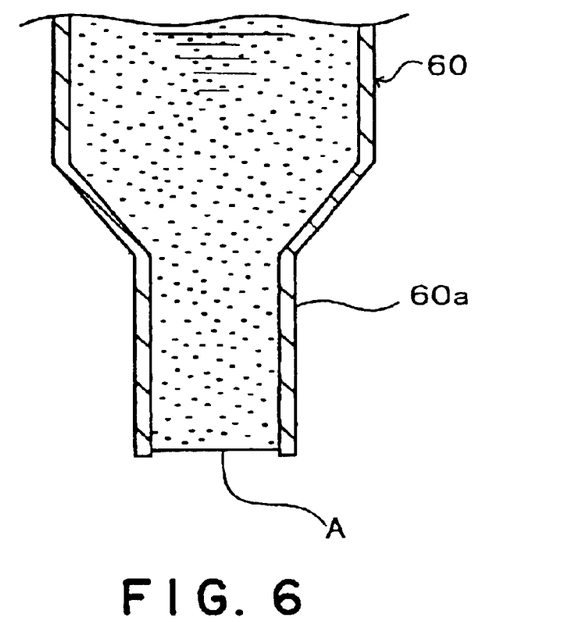
FIG. 6 is a vertical sectional view illustrating a coating-solution spray nozzle, indicating a nozzle-inside state when spraying of coating solution halts.

The open/close valve 67 is opened to allow a specific amount of coating solution such as polyphenylene to be sprayed onto the wafer center from the coating-solution spray nozzle 60. The valve 67 is closed for halting spraying on completion of spraying a specific amount of coating solution. The top coating-solution surface A will be located near the opening of the nozzle 60, as illustrated in FIG. 6, when spraying is halted.

Figure 7:
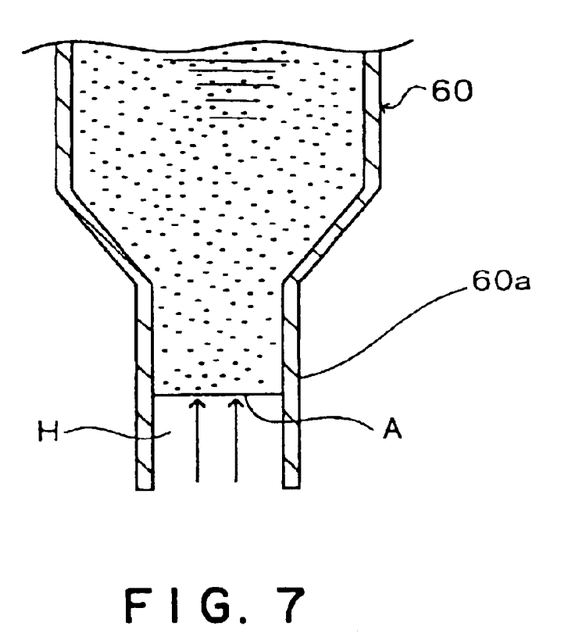
FIG. 7 is a vertical sectional view illustrating the coating-solution spray nozzle, indicating a nozzle-inside state while the top surface of the coating solution is being sucked back.

The suck-back valve 68 is then operated to suck the top coating-solution surface A to the coating-solution supply pipe 64 side, so that gas H (evaporated solvent) existing in the casing 17a is aspirated into the tip 60a of the coating-solution spray nozzle 60. The distance for the surface A to be sucked from the opening to the inside of the nozzle is preferably in the range from 1.0 to 5.0 mm. Further sucking of the surface A beyond this range could generate bubbles in the gas H and hence cause troubles in the coating process for the next wafer W.

The wafer W now placed in the coating-processing unit 17 is rotated at a specific speed such as 1500 rpm on completion of spraying the specific amount of coating solution. The wafer rotation allows the coating solution to be spread from the center to the outer surface of the wafer W. The wafer-rotation speed is increased to, for example, 2000 rpm when the coating solution has been spread over the wafer surface, thus a coating film of a specific thickness being formed on the wafer W.

Figure 8:
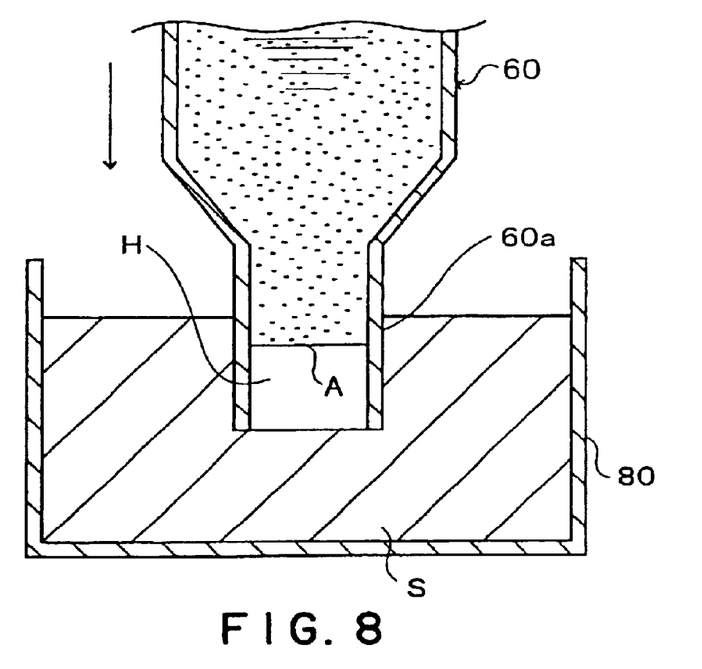
FIG. 8 is a vertical sectional view illustrating the coating-solution spray nozzle, indicating a nozzle-inside state while the nozzle is being soaked into a solvent.

The coating-solution spray nozzle 60 is moved along the guide rail 63 to the solution bath 80, for example, while the wafer is being under the coating-film forming process. The nozzle arm 61 is descended when the nozzle 60 has reached over the bath 80, to allow the tip 60a of the nozzle 60 to be soaked into a solvent S in the bath 80, as illustrated in FIG. 8, So that the nozzle outer wall can be washed by the solvent S.

Figure 9:
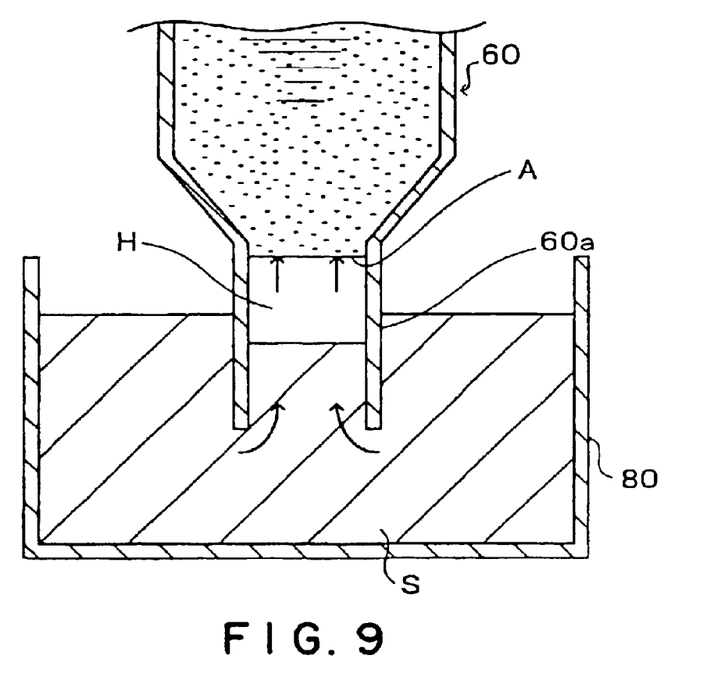
FIG. 9 is a vertical sectional view illustrating the coating-solution spray nozzle, indicating a nozzle-inside state while the solvent is being aspirated into the nozzle.

The suck-back valve 68 is operated to suck up the coating solution in the coating-solution splay spray nozzle 60 to further suck back the top coating-solution surface A to the coating-solution supply pipe 64 side, to allow a specific amount of solvent S to be aspirated into the nozzle 60 from the bath 80. The inner wall of the tip 60a of the nozzle 60 is then washed by the aspirated solvent S while the coating solution is entrapped in the nozzle 60 by the aspirated solvent S and isolated from the other gas in the casing 17a. The isolation prevents the coating solution in the nozzle 60 from being dried. The distance for the surface A to be further sucked up to the inside of the nozzle 60 is also preferably in the range from 1.0 to 5.0 mm.

Figure 10:
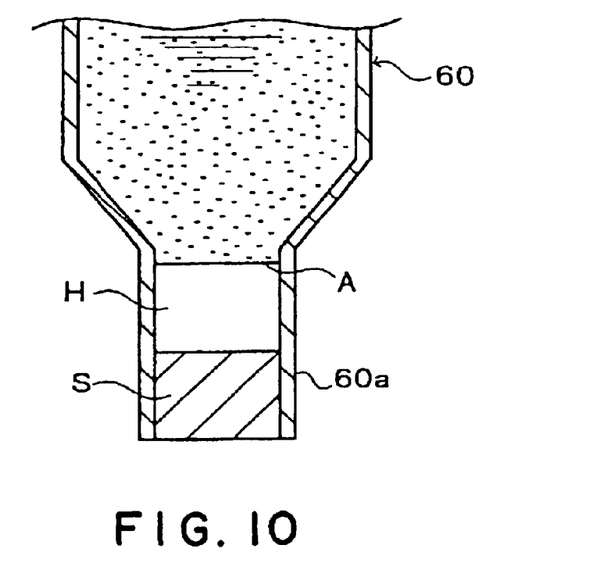
FIG. 10 is a vertical sectional view illustrating the coating-solution spray nozzle, indicating a nozzle-inside state while the nozzle is in a waiting mode.

The coating-solution spray nozzle 60 is ascended by the nozzle arm 61 to leave the bath 80 while the solvent S remains in the tip 60a of the nozzle 60, as illustrated in FIG. 10. The nozzle 60 is then moved to the waiting section 81 to stand ready for the next coating-solution spraying step. The solvent S remaining in the tip 60a of the nozzle 60 isolates the coating solution from the ambient atmosphere in the casing 17a and thus prevents drying.

The wafer-rotation speed is decreased to, for example, 500 rpm after a coating film has been formed on the wafer W. Thinner is supplied on the wafer rear surface for rear-surface washing. On completion of the rear-surface washing for a specific period, the supply of thinner is halted and the wafer W is dried while rotating. The rotating wafer W is stopped on completion of the drying process and passed to the main transfer mechanism 13 from the spin chuck 50 and thus taken away from the coating-processing unit 17.

Test spraying (dummy dispensing) is conducted for the coating-solution spray nozzle 60, for example, in the waiting section 81 before the nozzle 60 is moved over the center of the next wafer that has, for example, been transferred into the coating-processing unit 17, to discharge the solvent remaining in the tip 60a of the nozzle 60.

According to the embodiment disclosed above, the top surface A of the coating solution remaining in the coating-solution spray nozzle 60 is sucked back followed by soaking the nozzle 60 into the solvent S in the bath 80 via the gas H (evaporated solvent).

These successive steps prevent the coating solution remaining in the coating-solution spray nozzle 60 from being mixed with the solvent S in the bath 80 and hence from being deteriorated for the next wafer W to be processed. Soaking the nozzle 60 into the solvent S in the bath 80 washes away the coating solution attached to the outer wall of the tip 60a of the nozzle 60.

Moreover, further sucking back of the coating-solution top surface A in the coating-solution splay soray nozzle 60 to suck up the solvent S in the bath 80 while the nozzle 60 is being soaked into the solvent S entraps the coating solution in the nozzle 60 with the sucked up solvent. The entrapment prevents the coating solution in the nozzle 60 from being exposed to the ambient atmosphere and dried.

The gas H (evaporated solvent) intervening between the coating solution and the solvent S in the coating-solution spray nozzle 60 in the first sucking-back step prevents the coating solution from being mixed with the solvent. The solvent S sucked up in the tip 60a of the nozzle 60 in the second sucking-back step then washes the inner wall of the nozzle 60.

Moreover, the test spraying for the coating-solution spray nozzle 60 before spraying to the next wafer discharges the solvent S in the nozzle 60, thus the coating solution only being supplied to the next wafer.

Soaking the coating-solution spray nozzle 60 into the solvent S in the bath 80 may not only be performed per completion of processing one wafer but per specific number of wafers, per specific period, per lot, per modification to control recipe or per halt to the coating-processing unit 17.

The coating-solution spray nozzle 60 will be moved to the waiting section 81 on completion of spraying to stand ready for the next wafer when the nozzle 60 does not require being soaked into the solvent S in the bath 80.

The solvent S in the bath 80 requires periodical replacements under measurements of the number of soaking the coating-solution spray nozzle 60 into the solvent 5, a period of soaking, a dielectric constant of the solvent S varying in the soaking process or other factors by sensors.

The solvent S aspirated into the coating-solution spray nozzle 60 may be shifted therein under control of the suck-back valve 68 and the open/close valve 67. In detail, the top surface A of the coating solution in the nozzle 60 may be sucked back under control of the suck-back valve 68 to shift the solvent S to the coating-solution supply pipe 64 side, followed by opening the open/close valve 67 for a moment to shift the solvent S to the tip 60a side, and again to the supply pipe 64 side. This reciprocating motion of the solvent S in the nozzle 60 several times allows impurities attached on the inner wall of the nozzle 60 to be washed away. The reciprocating motion of the solvent S may be conducted any times according to need.

Figure 11:
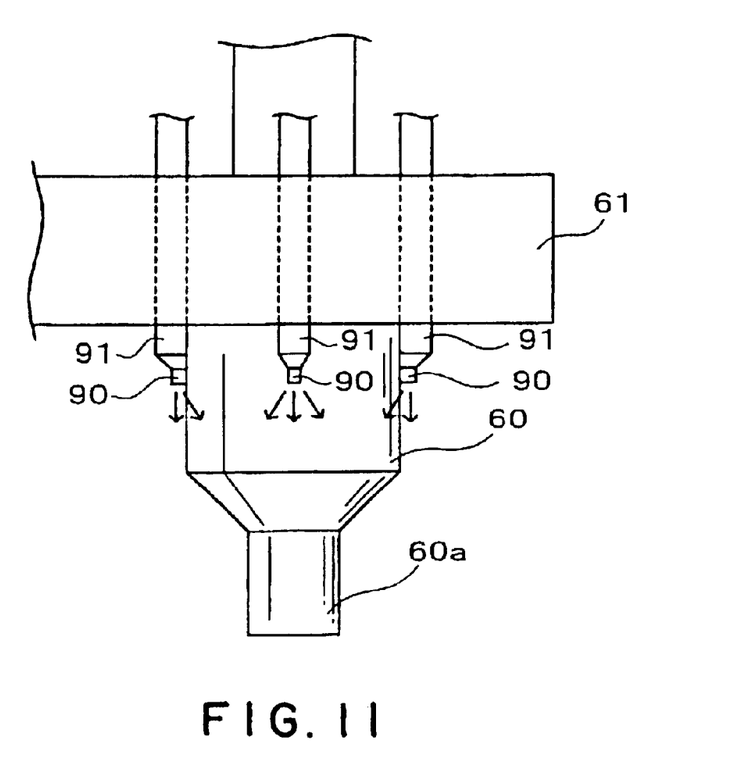
FIG. 11 is a sectional view illustrating a coating-solution spray nozzle having several solvent-supply nozzles.

In addition to the several steps disclosed above in the embodiment, a solvent for a coating solution may be supplied onto the outer wall of the coating-solution spray nozzle 60. In detail, as shown in FIG. 11, several solvent-supply nozzles 90 are arranged around the upper part of the outer wall of the nozzle 60 with an equal space. Connected to each nozzle 90 is a solvent-supply pipe 91 communicated with a solvent supplier (not shown). A solvent is supplied to the outer wall of the nozzle 60 from each nozzle 90 when the nozzle 60 has been lifted from the bath 80.

The solvent will flow down along the outer wall of the nozzle 60 to wash the outer wall, and be dropped into the bath 80, for example. The impurities attached to the outer wall of the nozzle 60, which particularly could not be washed away by soaking the nozzle 60 in the bath 80, can be washed away under this arrangement. Instead of solvent, nitrogen gas may be sprayed through the nozzles 90 on the outer wall of the nozzle 60 to wash the outer wall.

Instead of the gas H (evaporated solvent) in the embodiment, a purified water insoluble in the coating solution and solvent may be aspirated into the coating-solution spray nozzle 60 by sucking back the top surface A of the coating solution.

Figure 12:
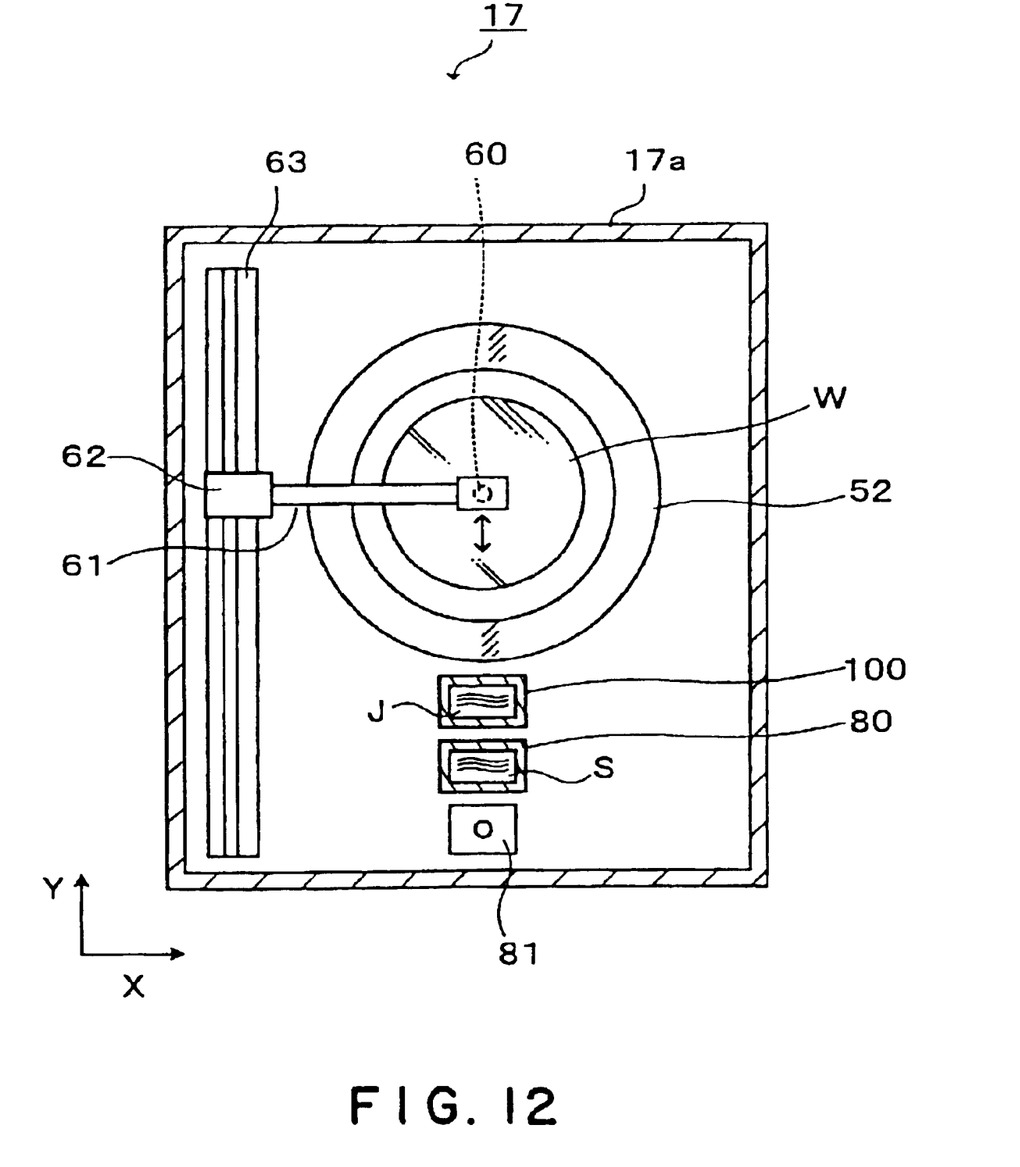
FIG. 12 is a horizontal sectional view illustrating a coating-processing unit having a purified-water bath.
Figure 13:
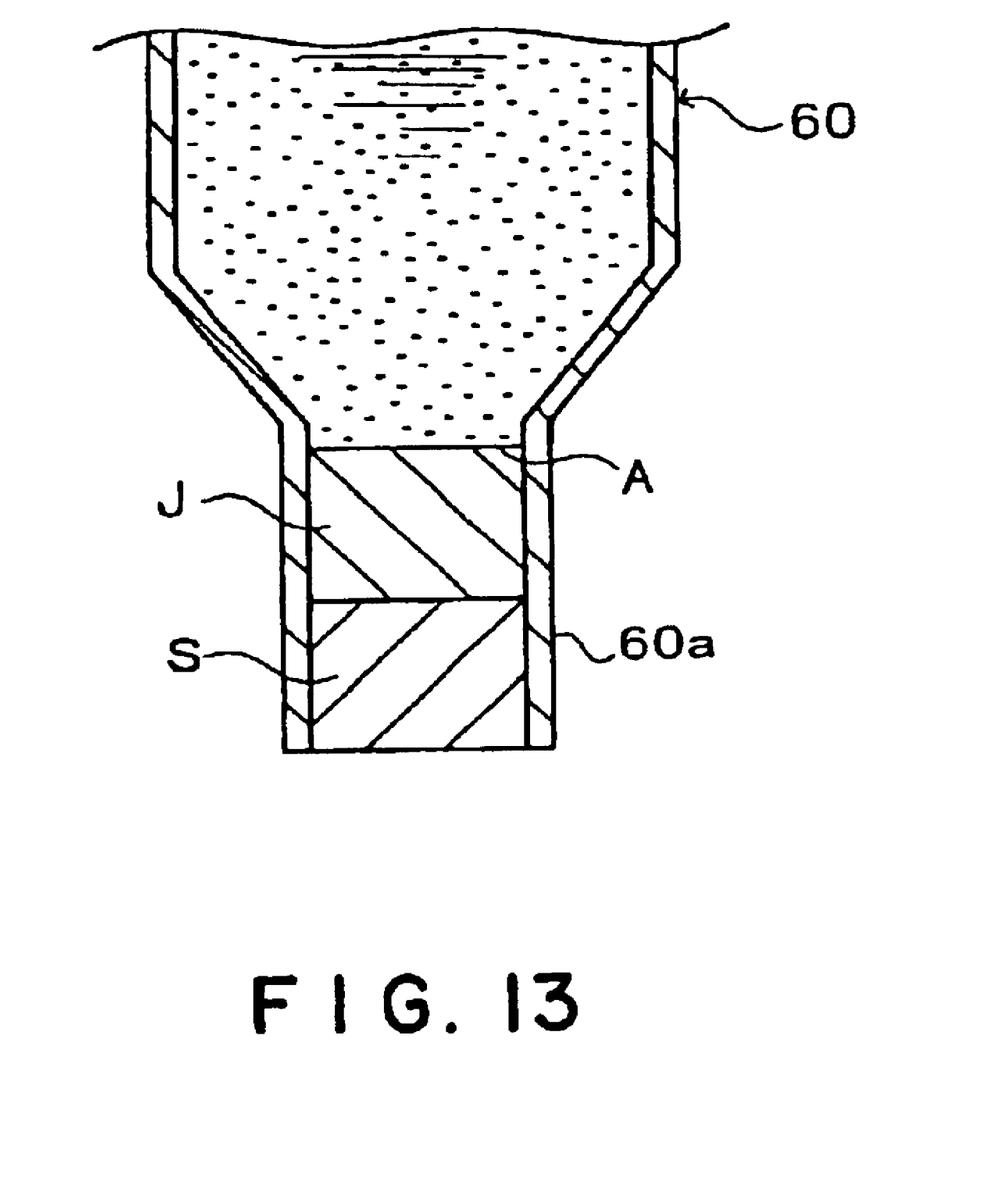
FIG. 13 is a vertical sectional view illustrating the coating-solution spray nozzle, indicating a nozzle-inside state while a purified water is intervening between coating solution and solvent.

As shown in FIG. 12, a purified water J can be supplied from a purified-water bath 100 provided close to the solution bath 80. On completion of spraying, the coating-solution spray nozzle 60 is moved onto the bath 100 and soaked into the purified water J. The suck-back valve 68 is operated so that a specific amount of the purified water J can be aspirated into the nozzle 60. The nozzle 60 is then moved onto the bath 80 and soaked into the solvent S. The solvent S is aspirated into the nozzle 60 as disclosed in the embodiment so that, as illustrated in FIG. 13, the purified water J can intervene between the coating solution and the solvent S in the nozzle 60 to prevent the coating solution from being mixed with the solvent S and from drying.

Not only the purified water, but any liquid that is insoluble in the coating solution and solvent can be used in accordance with the types of coating solution and solvent.

The embodiment disclosed above is related to a method of forming a coating film on a wafer in which a coating solution sprayed on the wafer center is spread over the wafer while rotating.

Not only that, the present invention is applicable to a so-called one-stroke coating method in which a coating solution is supplied on a wafer, for example, to form a pulse-like pattern of the coating solution thereon, while a coating-solution spray nozzle is moving over the rotating wafer in relative movement, thus forming a coating film on the wafer. Also applicable is a coating method using a slit nozzle, for supplying a slit-like pattern of a coating solution on a wafer.

The embodiment is related to a processing method for forming a SOD film. Not only a SOD film, the present invention is applicable to a processing method for forming a SOG film as an insulating film, a polyimide or resist film as a protection film, etc.

Moreover, not only a processing method for forming a coating film as disclosed above, the present invention is applicable to other processes such as developing. Furthermore, not only wafer substrates, the present invention is applicable to other substrates, such as, LCD substrates, mask substrates and reticle substrates.

As disclosed above in detail, a method of processing a wafer according to the present invention includes the following steps: A specific amount of a processing solution is supplied on a wafer by spraying the processing solution from a first end (tip) of a nozzle. The solution surface of the processing solution remaining in the nozzle is sucked back to a second end side of the nozzle by aspirating the remaining processing solution to the second end side. The first end of the nozzle is then soaked into a fluid. The processing solution remaining in the nozzle is aspirated to the second end side to aspirate a specific amount of the fluid into the first end of the nozzle for further sucking back the solution surface of the processing solution to the second end side, thus the solution surface of the processing solution being not touching the fluid.

When the surface of processing solution has been suck backed to the second end side of the nozzle, an insoluble liquid, that is insoluble in the coating solution and the fluid, may be aspirated into the nozzle, followed by soaking the first end of the nozzle into the fluid and aspirating the specific amount of the fluid into the first end of the nozzle, thus the solution surface of the processing solution being not touching the fluid due to the insoluble liquid intervening between the solution surface of the processing solution and the fluid.

According to the method of processing a wafer in the present invention, a specific amount of fluid such as a solvent for the coating solution is aspirated into the tip of the nozzle, thus the nozzle is closed at the tip so that the coating solution in the nozzle can be isolated from the ambient atmosphere. Therefore, the coating solution in the nozzle can be protected from being evaporated and deteriorated.

Moreover, once the surface of the coating solution is sucked back, the surrounding gas (evaporated solvent) or an insoluble liquid is aspirated and then the fluid is aspirated. The gas or insoluble liquid intervening between the fluid and the coating solution prevents the coating solution from being mixed with the fluid. Soaking the nozzle tip into the fluid for aspirating the fluid into the nozzle allows the coating solution attached to the outer wall of the nozzle to be washed away. The nozzle inner wall is also washed by the aspirated fluid.

According to the method of processing a wafer in the present invention, the fluid (and insoluble liquid) may be discharged from the tip of the nozzle before spraying the processing solution onto a next wafer to be processed. This step allows the processing solution only to be supplied to the next wafer.

According to the method of processing a wafer in the present invention, the fluid aspirated into the nozzle may be moved forward and backward in the tip of the nozzle. Impurities attached to the nozzle inside wall are washed away in this step, thus the nozzle inside wall being more washed.

According to the method of processing a wafer in the present invention, a fluid such as a solvent for the processing solution or nitrogen gas may be supplied to the outer wall of the nozzle, thus washing away impurities attached to the nozzle outer wall. The steps of soaking the nozzle into the fluid and supplying the fluid or nitrogen gas to the nozzle outer wall wash the nozzle enough.

As disclosed above, a processing solution in the nozzle can be protected from deterioration, and thus the present invention achieves decrease in dummy dispensing before supplying a pure coating solution to the next wafer and hence achieving low cost. The processing solution in the nozzle can further be protected from being mixed with impurities, thus the present invention achieves high substrate yields. Moreover, the present invention prevents generation of particles, which could otherwise occur due to contamination of the nozzle, thus providing substrate processing in a very cleaned environment.

What is claimed is:

1. A method of processing a wafer comprising:
   a supplying step of supplying a specific amount of a processing solution on a wafer by spraying the processing solution from a first end of a nozzle;
   a sucking-back step, after the supplying step, of sucking back a solution surface of the processing solution remaining in the nozzle to a second end side of the nozzle by aspirating the remaining processing solution to the second end side;
   a soaking step, after the sucking-back step, of soaking the first end of the nozzle into a fluid; and
   an aspirating step, after the soaking step, of aspirating the processing solution remaining in the nozzle to the second end side to aspirate a specific amount of the fluid into the first end of the nozzle and to further suck back the solution surface of the processing solution to the second end side, such that the solution surface of the processing solution does not contact the fluid.

2. The method of processing a wafer according to claim 1, wherein the sucking-back step comprises a step of sucking back the solution surface of the processing solution in the nozzle to aspirate gas evaporated from the fluid and the aspirating step comprises a step of aspirating the specific amount of the fluid into the first end of the nozzle such that the solution surface of the processing solution does not contact the fluid due to the evaporated gas intervening between the solution surface of the processing solution and the fluid.

3. The method of processing a wafer according to claim 1 further comprising a step, after the sucking-back step but and before the soaking step, of aspirating an insoluble liquid, which is insoluble in the coating solution and the fluid, into the nozzle, wherein the aspirating step comprises a step of aspirating the specific amount of the fluid into the first end of the nozzle, such that the solution surface of the processing solution does not contact the fluid due to the insoluble liquid intervening between the solution surface of the processing solution and the fluid.

4. The method of processing a wafer according to claim 1 further comprising a step of discharging the fluid from the first end of the nozzle before spraying the processing solution onto a next wafer.

5. The method of processing a wafer according to claim 3 further comprising a step of discharging the fluid and the insoluble liquid from the first end of the nozzle before spraying the processing solution onto a next wafer.

6. The method of processing a wafer according to claim 1 further comprising a step of moving the fluid aspirated into the nozzle forward and backward in the first end of the nozzle.

7. The method of processing a wafer according to claim 1, wherein the fluid comprises a solvent for the processing solution.

8. The method of processing a wafer according to claim 1 further comprising a step of washing an outer wall of the nozzle.

9. The method of processing a wafer according to claim 8, wherein the washing step comprises a step of supplying a solvent to the outer wall of the nozzle to wash the outer wall.

10. The method of processing a wafer according to claim 8, wherein the washing step comprises a step of spraying nitrogen gas to the outer wall of the nozzle to wash the outer wall.

11. The method of processing a wafer according to claim 1 further comprising a step of measuring at least one of a period of time for soaking the first end of the nozzle in the fluid a specific number of times for soaking the first end of the nozzle into the fluid, and a dielectric constant of the fluid.

12. The method of processing according to claim 1 further comprising a step of moving the fluid aspirated into the nozzle forward and backward repeatedly in the first end of the nozzle.

13. A method of processing a wafer comprising:
   a supplying step of supplying a specific amount of a processing solution on a wafer by spraying the processing solution from a first end of a nozzle;
   a sucking-back step, after the supplying step, of sucking back a solution surface of the processing solution remaining in the nozzle to a second end side of the nozzle by aspirating the remaining processing solution to the second end side;
   a first aspiration step, after the sucking back step, of aspirating an insoluble liquid, which is insoluble in the processing solution and a fluid, into the nozzle;
   a soaking step, after the first aspirating step, of soaking the first end of the nozzle into the fluid; and
   a second aspirating step, after the soaking step, of aspirating the processing solution remaining in the nozzle to the second end side to aspirate a specific amount of the fluid into the first end of the nozzle for further sucking back the solution surface of the processing solution to the second end side such that the solution surface of the processing solution does not contact the fluid due to the insoluble liquid intervening between the solution surface of the processing solution and the fluid.

14. The method according to claim 13, further comprising:

a discharging step of discharging the fluid and the insoluble liquid from the first end of the nozzle before spraying the processing solution onto a next wafer.

* * * * *